United States Patent [19]

Billings et al.

[11] Patent Number: 5,044,912
[45] Date of Patent: Sep. 3, 1991

[54] MOLD ASSEMBLY HAVING POSITIONING MEANS

[75] Inventors: David Billings, Mesa, Ariz.; Soon C. Hong, Seoul, Rep. of Korea

[73] Assignee: Motorola, Inc., Schaumburg, Ill.

[21] Appl. No.: 448,490

[22] Filed: Dec. 11, 1989

[51] Int. Cl.⁵ .............. B29C 45/14; B29C 45/16; B29C 39/10; B29C 39/12
[52] U.S. Cl. ...................... 425/116; 425/127
[58] Field of Search ........... 264/275, 272.15, 285; 425/116, 117, 127, 129.1

[56] References Cited

U.S. PATENT DOCUMENTS

| | | | |
|---|---|---|---|
| 3,551,956 | 1/1971 | Rosier | 264/275 |
| 3,696,507 | 10/1972 | Unger et al. | 425/117 |
| 4,003,544 | 1/1977 | Bliven et al. | 425/121 |
| 4,162,138 | 7/1979 | Byrne | 425/129.1 |
| 4,213,238 | 7/1980 | Gudorf | 249/83 |
| 4,332,537 | 6/1982 | Slepcevic | 425/127 |
| 4,442,056 | 4/1984 | Slepcevic | 425/121 |
| 4,449,690 | 5/1984 | Schroeder | 249/83 |
| 4,470,786 | 9/1984 | Sano et al. | 425/116 |
| 4,480,975 | 11/1984 | Plummer et al. | 425/121 |
| 4,513,942 | 4/1985 | Creasman | 425/121 |
| 4,555,086 | 11/1985 | Kiyotoma | 425/116 |
| 4,615,857 | 10/1986 | Baird | 425/121 |
| 4,793,785 | 12/1988 | Osada | 425/116 |
| 4,900,501 | 2/1990 | Saeki et al. | 425/116 |
| 4,954,307 | 9/1990 | Yokoyama | 264/272.15 |
| 4,959,000 | 9/1990 | Giza | 425/129.1 |

*Primary Examiner*—Willard E. Hoag
*Attorney, Agent, or Firm*—Joe E. Barbee

[57] ABSTRACT

A mold assembly having a first mold half and a second mold half forms a cavity when the first and second mold halves are mated together. Pins or projections, which extend into the cavity, are provided by the mold halves. A semiconductor leadframe rests on the pins provided by the lower mold half and are spaced a short distance from the pins provided by the upper mold half. The pins from the lower mold half support the leadframe whereas the upper mold half pins restrict the movement of the leadframe during an encapsulating procedure. By shortening the pins from the upper mold half the entire upper surface of the leadframe is encapsulated. This eliminates the necessity of having to backfill the holes left in the encapsulating material after the encapsulating procedure.

5 Claims, 1 Drawing Sheet

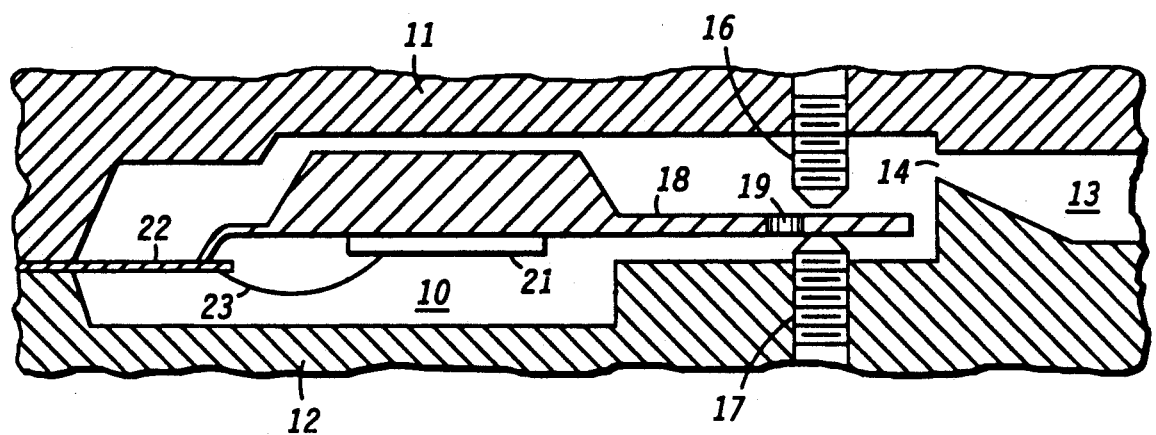
FIG. 1
FIG. 2
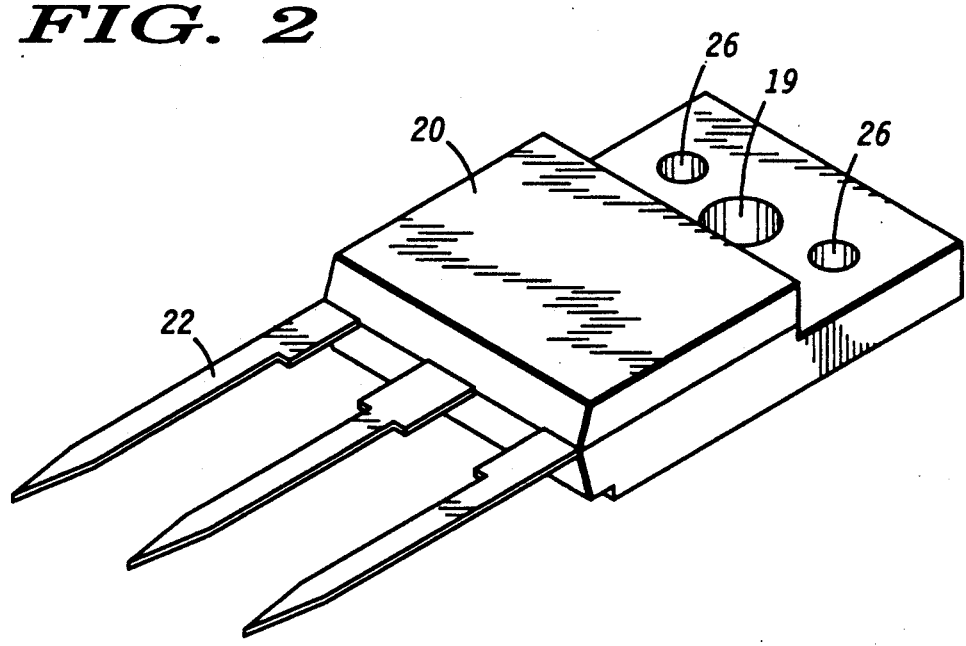

MOLD ASSEMBLY HAVING POSITIONING MEANS

BACKGROUND OF THE INVENTION

The present invention relates, in general, to a mold assembly for encapsulating semiconductor devices, and more particularly, to a mold assembly having positioning means for positioning the semiconductor device within a cavity of the mold.

Mold assemblies for encapsulating semiconductor devices to form semiconductor packages are well known. There are many different semiconductor packages to meet different user requirements or to accommodate the many different semiconductor devices. Some semiconductor packages completely encapsulate the semiconductor device and the heatsink on which it is mounted. Other semiconductor packages leave exposed at least one surface of a heatsink upon which the semiconductor device is mounted. This exposed surface of the heatsink can later be mounted or mated to a heat exchanger to facilitate removal of heat from the semiconductor device. Many of the semiconductor packages have become standardized by JEDEC and are known by designations such as TO-218, TO-220, etc. A problem arises when the semiconductor packages that have interface pins extending from only one side of the package need to have the heatsink entirely encapsulated. In the past such heatsinks have been held in position within the cavity of a mold assembly by straight pins extending from the top and bottom of the mold assembly itself. These straight pins made physical contact with the top and bottom sides of the heatsink holding the heatsink in a position away from the walls of the cavity. Since the heatsink was positioned away from the walls, encapsulating material could completely surround the heatsink except for the small area where the pins made contact to the heatsink.

After the encapsulating procedure was completed, foreign material such as encapsulating material bleed or mold release compound had to be cleaned from the holes left in the encapsulating material by the straight pins, and then these holes had to be filled with a backfill material such as an epoxy or silicone. This was a time consuming procedure and was very labor intensive.

Accordingly, it is an object of the present invention to provide a mold assembly and method of using the same that entirely encapsulates one side of a heatsink while providing point contact positioning means on the opposite side of the heatsink.

Another object of the present invention is to provide a tapered configuration to the positioning means.

Yet another object of the present invention is to provide means within a mold cavity for holding a heatsink in a desired position wherein direct contact is not made to one side of the heatsink.

SUMMARY OF THE INVENTION

The above and other objects and advantages of the present invention are achieved by using positioning means such as protrusions or projections which extend into a mold cavity. The projections support one side of a portion of a leadframe inserted into the cavity. Projections on the opposite side of the leadframe are spaced a short distance from the leadframe and restrict movement of the leadframe. In a preferred embodiment, the projections, which are commonly called pins, are tapered so that once encapsulation is complete the indentations left in the encapsulation caused by the pins will have a wider opening at the surface of the encapsulation than the opening adjacent to the leadframe.

Also provided is a method for encapsulating the semiconductor device using a mold cavity having pins extending into the cavity itself. After the encapsulated semiconductor device is removed from the mold cavity, cleaning is performed on the openings left in one side of the encapsulation by the pins. After the openings are cleaned, they are backfilled with a filling compound.

BRIEF DESCRIPTION OF DRAWINGS

FIG. 1 is a cross-sectional view of a mold assembly having pins extending into its cavity to support one end of a leadframe; and FIG. 2 is a prospective view of a semiconductor device after it has been encapsulated in the mold assembly of FIG. 1.

DETAILED DESCRIPTION OF DRAWINGS

FIG. 1 is a cross-sectional view of an upper mold half 11 and a lower mold half 12 which are mated together forming a cavity 10 therebetween. The mold assembly also has a chase or runner 13 and a gate 14. An end of chase 13 is connected to a supply of encapsulating material which is forced through chase or runner 13 and through gate 14 into cavity 10. Cavity 10 contains a leadframe having a heatsink 18 and a plurality of leads 22. Mounted on one surface of heatsink 18 is a semiconductor device 21. Semiconductor device 21 is connected by thin wires 23 to leads 22. In the embodiment illustrated in FIG. 1, one pin 22 is directly connected to heatsink 18. A portion of heatsink 18 has an opening 19 which serves as a mounting hole in order to mount the encapsulated semiconductor device to a heat exchanger as will become more apparent hereinafter. The portion of leadframe or heatsink 18 having hole 19 is supported by a pin 17 which extends into cavity 10. A pin 16 extends into cavity 10 from upper mold half 11. It will be understood that although pins 16 and 17 are illustrated as screws, they can be any small projections or support means for holding heatsink 18 in a desired position. A portion of leads 22 extend from cavity 10 so that they will not be encapsulated.

As encapsulating material is forced down chase 13 through gate 14 and then to mold cavity 10, it will eventually entirely fill cavity 10. Since it is desired for entire heatsink 18 to be encapsulated, protrusion 17 supports heatsink 18 so that encapsulating material can surround the bottom of heatsink 18. Pin 16 extends into cavity 10 and will keep heatsink 18 from becoming misaligned or moving too far from its desired alignment position. The distance provided between pin 16 and heatsink 18 will allow encapsulating material to cover the entire top surface of heatsink 18. In a preferred embodiment, two pins 17 are used on the bottom side of heatsink 18 and two pins 16 are used on the top side of heatsink 18. Since the encapsulating material entering cavity 10 will be under a pressure of approximately 105 kilograms per square centimeter, upper pin 16 is needed in order to prevent this high pressure from deforming or misaligning heatsink 18. Pins 16 and 17 are illustrated as being tapered in order to facilitate the cleaning of holes left in the encapsulating material after the encapsulating process is complete.

After the encapsulating procedure is complete, the molded semiconductor device is removed from cavity 10. FIG. 2 illustrates such an encapsulated device 20. This package configuration is a JEDEC TO-218 package. The encapsulating material encloses the entire package except for leads 22 extending from the encapsulated package and openings 26 which were made by pin 17 (See FIG. 1). Opening 19 is used by a bolt or any suitable attaching means to attach the encapsulated package to a heat exchanger. Opening 26 will typically contain encapsulant bleed or mold release compound. It is best that this foreign material in opening 26 be removed so that a backfill material such as an epoxy or silicone compound can be placed in openings 26, thereby entirely encapsulating heatsink 18. The taper of pin 17 greatly facilitates the cleaning of undesirable material in openings 26. Pins 16 will leave indentations on the backside of encapsulated package 20; however, the bottoms of these indentations will be filled with encapsulating material thereby insulating that portion of heatsink 18.

Once openings 26 are backfilled, electrical isolation tests can be performed on encapsulated package 20. The electrical isolation required in a typical package can be as high as 5,000 volts rms. Accordingly, the gap provided between tapered pin 16 and heatsink 18 will depend upon the dielectric constant of the encapsulating material used. It has been found that typically a gap of 0.0127 cm is sufficient to pass a voltage isolation test of 5,000 volts rms. Should encapsulated package 20 fail the electrical isolation test through the openings made by pins 16, it will be caused by heatsink 18 skewing or becoming misaligned within cavity 10. Therefore, pin 16 can become a good gauge or indication as to whether heatsink 18 has become misaligned within cavity 10 during encapsulation.

By now it should be appreciated that there has been provided an improved mold assembly and method of using the same to encapsulate semiconductor devices. The shortened pin which helps to keep the semiconductor device heatsink from becoming misaligned allows at least one side of the heatsink to be fully encapsulated. This eliminates the need for the holes made in one side of the encapsulated package from being cleaned and backfilled.

We claim:

1. A mold assembly having a first mold half and a second mold half and forming a cavity when the first and second mold halves are mated together, comprising: at least a first pin extending into the cavity from the first mold half; and at least a second pin extending into the cavity from the second mold half wherein the at least a first pin and the at least a second pin position a portion of a leadframe within the cavity, and wherein the at least a first pin is too short to make physical contact with the leadframe when the mold halves are mated and during encapsulation, so that when encapsulating material is forced into the cavity it will encapsulate the portion of the leadframe nearest the first pin.

2. The mold assembly of claim 1 wherein at least the second pin is tapered as it extends into the cavity.

3. A mold assembly for encapsulating a semiconductor device mounted on a leadframe wherein the mold assembly forms a cavity in which the semiconductor device is enclosed, the mold assembly having at least a first and a second projection extending into the cavity to maintain at least a portion of the leadframe upon which the semiconductor device is mounted in a predetermined position within the cavity, the first projection being of such length as to contact the leadframe and the second projection being of such length as to be spaced from the leadframe before and during encapsulation and to keep the leadframe substantially in the predetermined position during encapsulation and yet to allow encapsulating material to completely cover the side of the leadframe adjacent the second projection.

4. The mold assembly of claim 3 wherein the first projection is tapered.

5. The mold assembly of claim 3 wherein the second projection is tapered.

* * * * *